(12) United States Patent
Howard

(10) Patent No.: US 6,313,022 B1
(45) Date of Patent: *Nov. 6, 2001

(54) RECESSED-CONTAINER CELLS AND METHOD OF FORMING THE SAME

(75) Inventor: Bradley J. Howard, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/404,040

(22) Filed: Sep. 23, 1999

Related U.S. Application Data

(62) Division of application No. 08/959,620, filed on Oct. 28, 1997.

(51) Int. Cl.$^7$ .................... H01L 21/3205; H01L 21/4763
(52) U.S. Cl. ................. 438/594; 438/594; 438/239; 438/243; 438/244; 438/250; 438/253; 257/68
(58) Field of Search .................. 438/594, 221, 438/239–256; 257/68

(56) References Cited

U.S. PATENT DOCUMENTS

| | | | |
|---|---|---|---|
| 4,847,214 | 7/1989 | Robb et al. | 437/67 |
| 5,229,316 | 7/1993 | Lee et al. | 437/67 |
| 5,283,453 | 2/1994 | Rajeevakumar | 257/304 |
| 5,422,294 | 6/1995 | Noble, Jr. | 437/52 |
| 5,461,248 | 10/1995 | Jun | 257/301 |
| 5,468,979 | 11/1995 | Tani et al. | 257/304 |
| 5,543,348 | 8/1996 | Hammerl et al. | 437/60 |
| 5,555,520 | 9/1996 | Sudo et al. | 365/149 |
| 5,811,283 | 9/1998 | Sun | 438/244 |
| 5,888,877 | * 3/1999 | Dennison et al. | 438/386 |
| 5,963,814 | * 10/1999 | Walker et al. | 438/387 |
| 6,020,609 | * 2/2000 | Wu | 257/309 |

OTHER PUBLICATIONS

S. Wolf et al.; Wet Processing: Cleaning, Etching, and Liftoff; Silicon Processing for the VLSI Era; vol. I: Process Technology; 1986; pp. 514 and 529.

* cited by examiner

Primary Examiner—Matthew Smith
Assistant Examiner—Granvill D. Lee, Jr.
(74) Attorney, Agent, or Firm—Fletcher, Yoder & Van Someren

(57) ABSTRACT

A container capacitor having a recessed conductive layer. The recessed conductive layer is typically made of polysilicon. The recessed structure reduces the chances of polysilicon "floaters," which are traces of polysilicon that remain on the surface of the substrate, coupling adjacent capacitors together to create short circuits. The disclosed method of creating such a recessed structure uses successive etches. One of these etches selectively isolates a rim of the polysilicon within the container to recess the rim, while the remainder of the polysilicon in the container is protected by photoresist.

13 Claims, 4 Drawing Sheets

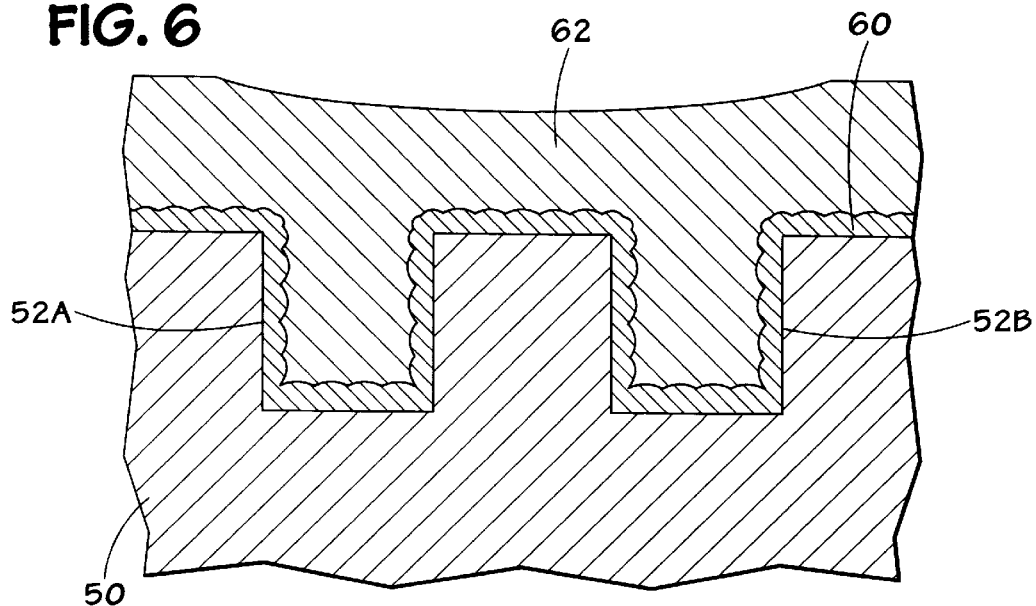
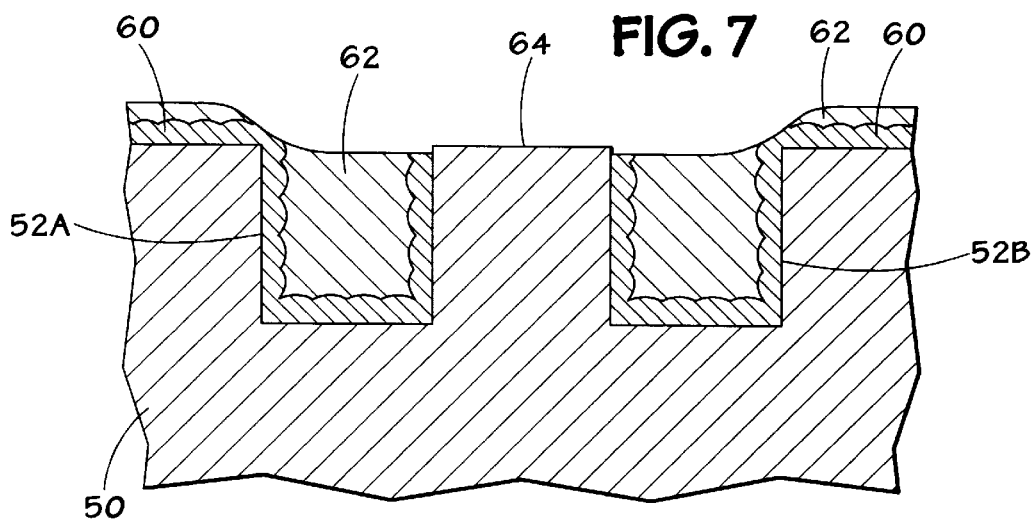
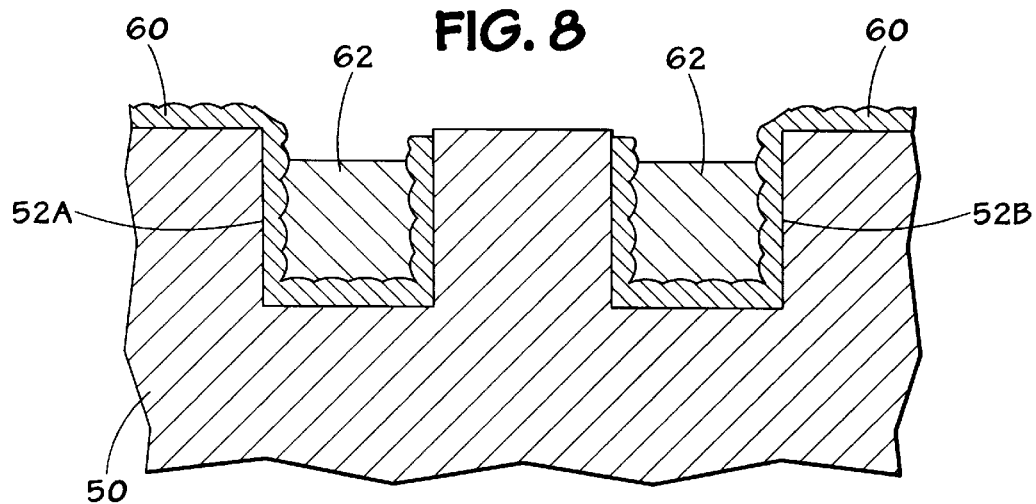

RECESSED-CONTAINER CELLS AND METHOD OF FORMING THE SAME

This application is a Divisional of application Ser. No. 08/959,620 filed Oct. 28, 1997.

BACKGROUND OF THE INVENTION

1. Field Of The Invention

The present invention relates generally to semiconductor processing and, more particularly, to a recessed structure and a method of forming the same.

2. Description Of The Related Art

Microprocessor-controlled integrated circuits are used in a wide variety of applications. Such applications include personal computers, vehicle control systems, telephone networks, and a host of consumer products. As is well known, microprocessors are essentially generic devices that perform specific functions under the control of a software program. This software program is typically stored in a memory device coupled to the microprocessor. Not only does the microprocessor access the memory device to retrieve the program instructions, it also typically stores and retrieves data created during execution of the program in the memory device.

There are a wide variety of different memory devices available for use in microprocessor-based systems. The type of memory device chosen for a specific function within a microprocessor-based system depends largely upon what features of the memory are best suited to perform the particularly function. Most microprocessor-based systems include a dynamic random access memory (DRAM). DRAMs are volatile memories that must be continually powered in order to retain the contents. However, DRAMs are quite advantageous in that they tend to provide greater storage capability and programming cycles than non-volatile memories, such as read only memories.

A typical DRAM includes a memory array in which memory cells are arranged in rows and columns. Conductive lines, called word lines, connect the memory cells in a given row together, while perpendicular conductive lines, called digit lines, connect memory cells in a given column together. Each DRAM memory cell typically includes an access device, such as a transistor, and a storage device, such as a capacitor. Information is stored in each DRAM memory cell as the presence or absence of a charge on the storage capacitor. In response to the appropriate voltages on a selected word line and digit line, the access transistor couples the storage capacitor to the digit line so that a sense amplifier can determine whether the storage capacitor contains a charge, commonly called a logical one, or no charge, commonly called a logical zero.

To fabricate as many memory cells as possible on a single chip, the size of each memory cell should be minimized. However, the minimization of the size of a storage capacitor in a DRAM memory cell is typically limited by the amount of charge that the storage capacitor is able to retain. In fact, one of the primary concerns in DRAM fabrication is the desire to pack memory cells densely while maintaining the required capacitance levels of the storage capacitors. Simply put, it is essential that the plates of the storage capacitors be large enough to retain a charge adequate to allow the sense amplifiers to determine whether the storage capacitor is storing a logical one or a logical zero.

For years after the initial development of the basic DRAM memory cell, the storage capacitors were formed as two dimensional, or planar, capacitors. In other words, the storage capacitors were formed by two flat layers of conductive material, such as polysilicon or metal, separated by a flat dielectric layer. As the density of the memory cells increased and the size of the memory cells decreased, the size of the planar plates of the storage capacitors was clearly a limiting factor hindering further size reductions.

To reduce the size of DRAM memory cells further, and to provide storage capacitors with adequate capacitance, three dimensional capacitors were developed. One common three dimensional capacitor is referred to as a container capacitor. A container capacitor is fabricated by forming a container in a dielectric or insulative substrate. A conductive material, such as polysilicon, is deposited onto the substrate so that it lines the surface of the container. Similarly, a dielectric layer is deposited over the substrate so that it lines the polysilicon layer within the container. Finally, a second layer of conductive material, such as polysilicon, is deposited over the substrate so that it lines the dielectric layer within the container. Clearly, a container capacitor's plates have a substantially greater area than a planar capacitor that occupies the same amount of die area.

Although container capacitors improved upon planar capacitors, they are not without their problems. During the fabrication of the first polysilicon layer of a container capacitor, it is not uncommon that residual polysilicon may remain on the substrate around the edge of the container. These polysilicon residues, sometimes called floaters, are conductive and, thus, can cause short circuits, typically between adjacent container capacitors in the memory array.

The present invention is directed to one or more of the problems set forth above.

SUMMARY OF THE INVENTION

In accordance with one aspect of the present invention, there is provided a microelectronic structure. The structure includes a container formed in a substrate which has an upper surface. A layer of conductive material is disposed in the container. The layer of conductive material has edges recessed below the upper surface of the substrate.

In accordance with another aspect of the present invention, there is provided a microelectronic structure. The structure includes a container formed in a dielectric material. The dielectric material has an upper surface, and the container has walls and a bottom surface. Conductive material is disposed on the walls and the bottom surface of the container. The conductive material on the walls is recessed below the upper surface of the dielectric material.

In accordance with still another aspect of the present invention, there is provided a capacitor in a semiconductor circuit The capacitor includes a container formed in a substrate that has an upper surface. A first layer of conductive-material is disposed in the container. The first layer of conductive material has edges recessed below the upper surface of the substrate. A layer of dielectric material is disposed over the first layer of conductive material. A second layer of conductive material is disposed on the layer of dielectric material.

In accordance with yet another aspect of the present invention, there is provided a memory cell for a semiconductor memory. The memory cell includes an access device and a capacitor coupled to the access device. The capacitor includes a container formed in a substrate that has an upper surface. A first layer of conductive material is disposed in the container. The first layer of conductive material has edges recessed below the upper surface of the substrate. A layer of dielectric material is disposed over the first layer of conductive material. A second layer of conductive material is disposed on the layer of dielectric material.

In accordance with a further aspect of the present invention, there is provided a method of forming a recessed microelectronic structure. The method includes the steps of: (a) forming a container in a dielectric material, the substrate having an upper surface; (b) disposing a layer of conductive material within the container and over the upper surface of the dielectric material; (c) disposing a layer of dissimilar material over the layer of conductive material; (d) removing the layer of dissimilar material and the layer of conductive material from at least a portion of the upper surface of the dielectric material; and (e) recessing the layer of conductive material remaining in the container below the upper surface of the container.

In accordance with an even further aspect of the present invention, there is provided a method of forming a recessed microelectronic structure. The method includes the steps of: (a) forming a container in a substrate, the substrate having an upper surface; (b) disposing a layer of conductive material within the container and over the upper surface of the substrate; (c) disposing a layer of photoresist over the layer of conductive material; (d) removing the layer of photoresist and the layer of conductive material from at least a portion of the upper surface of the substrate to expose a portion of the upper surface of the substrate adjacent the container; (e) recessing the layer of conductive material remaining in the container below the upper surface of the container; and (i) removing the layer of photoresist remaining in the container.

In accordance with a still further aspect of the present invention, there is provided a method of forming a recessed microelectronic structure. The method includes the steps of: (a) forming a container in a substrate, the substrate having an upper surface; (b) disposing a layer of conductive material within the container and over the upper surface of the substrate; (c) disposing a layer of photoresist over the layer of conductive material; (d) etching through a first portion of the layer of photoresist and a first portion of the layer of conductive material to expose a portion of the upper surface of the substrate adjacent the container; (e) etching through a second portion of the layer of photoresist remaining in the container; and (f) etching through a second portion of the layer of conductive material to remove the layer of conductive material from the upper surface of the substrate and to recess the layer of conductive material remaining in the container below the upper surface of the container.

In accordance with a yet further aspect of the present invention, there is provided a method of forming a capacitor in a microelectronic circuit. The method includes the steps of: (a) forming a container in a substrate, the substrate having an upper surface; (b) disposing a first layer of polysilicon within the container and over the upper surface of the substrate; (c) disposing a layer of photoresist over the first layer of polysilicon; (d) etching through a first portion of the layer of photoresist and a first portion of the first layer of polysilicon to expose a portion of the upper surface of the substrate adjacent the container; (e) etching through a second portion of the layer of photoresist remaining in the container; (f) etching through a second portion of the first layer of polysilicon to remove the first layer of polysilicon from the upper surface of the substrate and to recess the first layer of polysilicon remaining in the container below the upper surface of the container; (g) removing the layer of photoresist remaining in the container; (h) disposing a layer of dielectric material over the recessed first layer of polysilicon and over the upper surface of the substrate; (i) disposing a second layer of polysilicon over the layer of dielectric material; and (j) removing the layer of dielectric material and the second layer of polysilicon from the upper surface of the substrate.

BRIEF DESCRIPTION OF THE DRAWINGS

The foregoing and other advantages of the invention will become apparent upon reading the following detailed description and upon reference to the drawings in which:

FIG. 6 illustrates a layer of polysilicon and photoresist formed over the substrate and containers of FIG. 5;

FIG. 7 illustrates the structure of FIG. 6 after an etching process;

FIG. 8 illustrates the structure of FIG. 7 after a photoresist ash process;

DETAILED DESCRIPTION OF SPECIFIC EMBODIMENTS

Specific embodiments of memory elements and methods of making such memory elements are described below as they might be implemented for use in semiconductor memory circuits. In the interest of clarity, not all features of an actual implementation are described in the specification. It should be appreciated that in the development of any such actual implementation (as in any semiconductor engineering project), numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of semiconductor design and fabrication for those of ordinary skill having the benefit of this disclosure.

Figure 1:
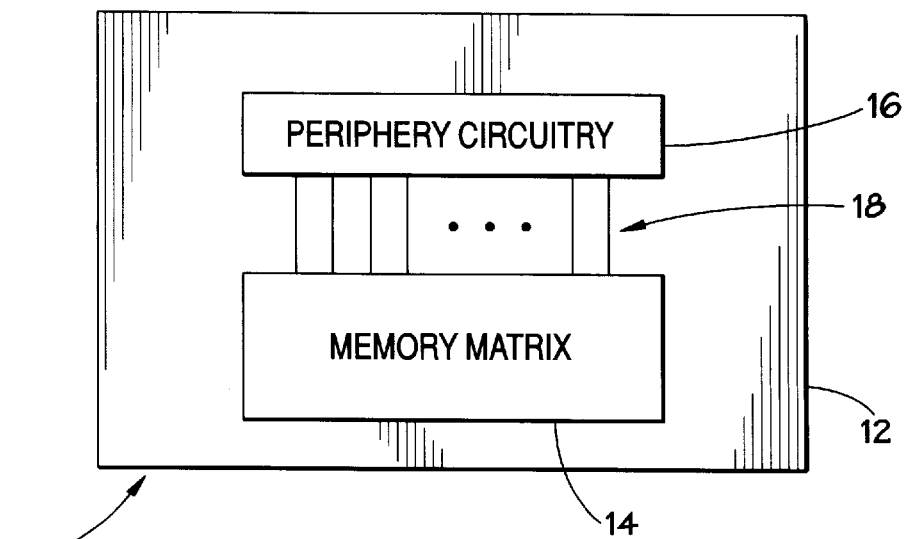
FIG. 1 illustrates a semiconductor memory.

Turning now to the drawings, and referring initially to FIG. 1, a memory device is illustrated and generally designated by a reference numeral 10. The memory device 10 is an integrated circuit memory that is advantageously formed on a semiconductor substrate 12. The memory device 10 includes a memory matrix or array 14 that includes a plurality of memory cells for storing data, as described below. The memory matrix 14 is coupled to periphery circuitry 16 by the plurality of control lines 18. The periphery circuitry 16 may include circuitry for addressing the memory cells contained within the memory matrix 14, along with circuitry for storing data in and retrieving data from the memory cells. The periphery circuitry 16 may also include other circuitry used for controlling or otherwise ensuring the proper functioning of the memory device 10.

Figure 2:
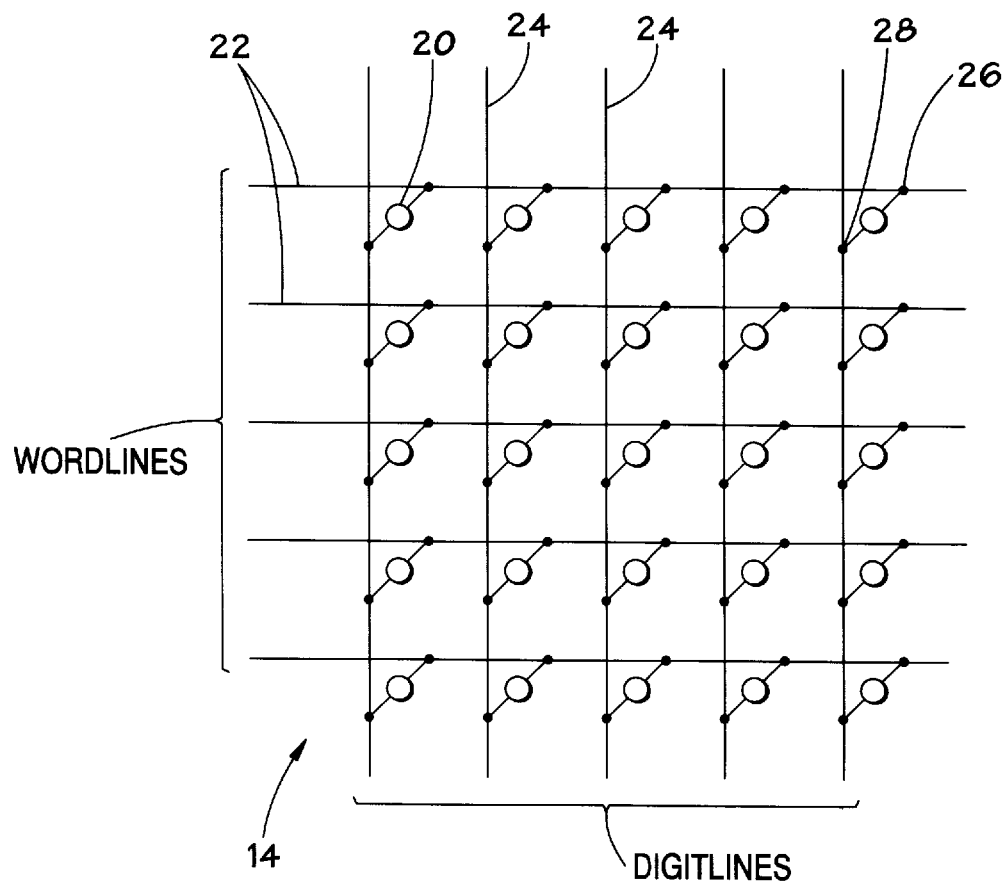
FIG. 2 illustrates a portion of a memory array of FIG. 1.

A more detailed description of the memory matrix 14 is illustrated in FIG. 2. As can be seen, the memory matrix 14 includes a plurality of memory cells 20 that are arranged in generally perpendicular rows and columns. The memory cells 20 in each row are coupled together by a respective word line 22, and the memory cells 20 in each column are coupled together by a respective digit line 24. Specifically, each memory cell 20 includes a word line node 26 that is coupled to a respective word line 22, and each memory cell 20 includes a digit line node 28 that is coupled to a respective digit line 24. The conductive word lines 22 and digit lines 24 are collectively referred to as address lines. These address lines may be electrically coupled to the periphery circuitry 16 so that each of the memory cells 20 can be accessed for storage and retrieval of information.

Figure 3:
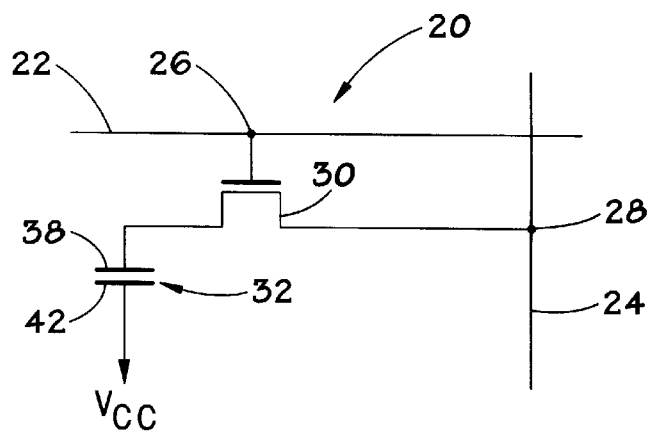
FIG. 3 illustrates an electric schematic diagram of an exemplary memory cell in the array of FIG. 2.

FIG. 3 illustrates an exemplary memory cell 20 that may be used in the memory matrix 14. The memory cell 20 includes a memory element 32 that is coupled to an access device 30. In this embodiment, the memory element 32 is illustrated as a storage capacitor, and the access device 30 is illustrated as a MOSFET transistor. The base of the transistor 30 is coupled to the word line 22 to form the word line node 26, and the source of the transistor 30 is coupled to the bit line 24 to form the bit line node 28. One plate 38 of the capacitor 32 is coupled to the drain of the transistor 30, and the other plate 42 of the capacitor 32 is coupled to $V_{cc}$, which is usually circuit ground.

Figure 4:
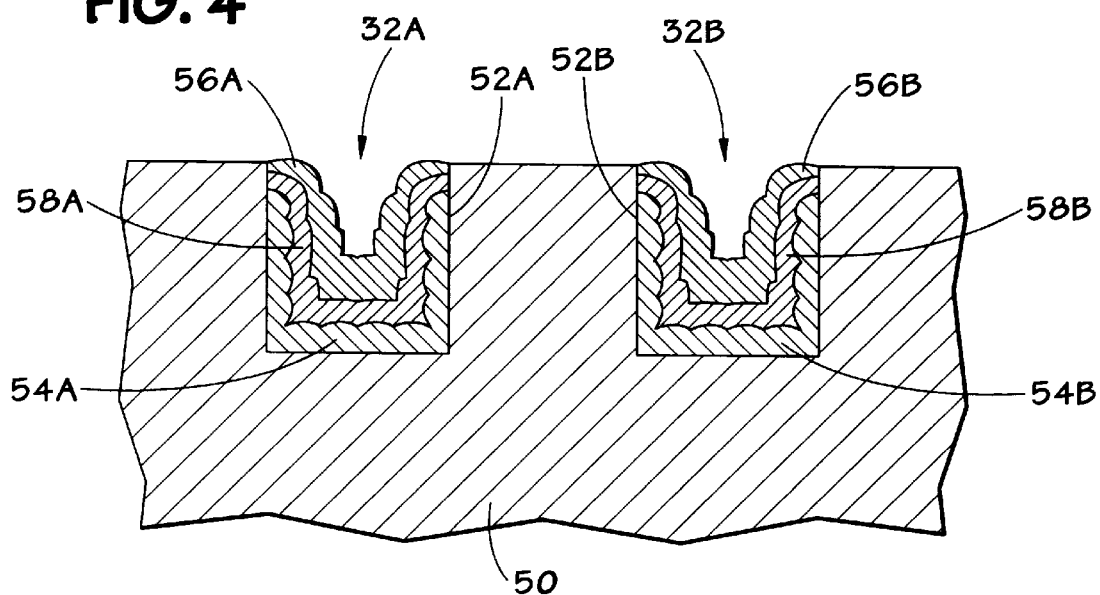
FIG. 4 illustrates a cross-sectional view of two container capacitors in accordance with the present invention.

The general operation of the memory device 10 as illustrated in FIGS. 1–3 is well known in the art, so such operation will not be described herein. However, the structure and fabrication of the storage capacitor 32 is unique. As illustrated in FIG. 4, two storage capacitors 32a and 32b are formed in a substrate 50. The substrate 50 is typically an exposed surface of an in-process wafer. In the disclosed embodiment, the substrate surrounding the storage capacitors 32a and 32b is advantageously comprised of a generally dielectric material, such as silicon oxide. It should be understood that suitable access devices 30 may be placed laterally or vertically with respect to the respective storage capacitors 32a and 32b and that such connections are not illustrated here. Although a memory cell 20 typically includes only one storage capacitor 32, two storage capacitors 32a and 32b are illustrated so that potential problems can be discussed subsequently with greater clarity.

As illustrated in FIG. 4, the storage capacitors 32a and 32b are formed in respective containers 52a and 52b. Each storage capacitor 32a and 32b includes a first layer of conductive material 54a and 54b and a second layer of conductive material 56a and 56b which form the lower and upper plates of the capacitors. The first conductive layers 54a and 54b are separated from the respective second conductive layers 56a and 56b by a respective layer of dielectric material 58a and 58b, which is disposed therebetween. As mentioned in reference to FIG. 3, one of the plates of each storage capacitor 32a and 32b will be coupled to $V_{cc}$ while the opposite plate will be coupled to the access device 30.

Figure 5:
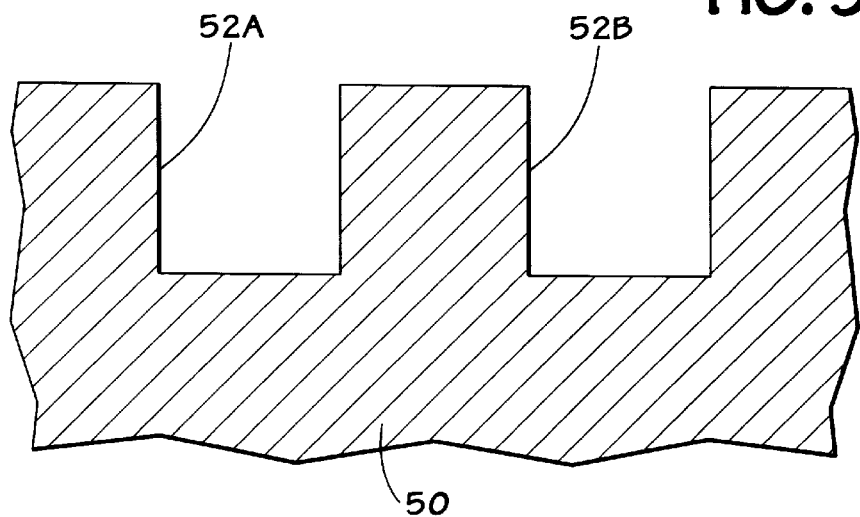
FIG. 5 illustrates a substrate having a pair of containers formed therein.

The fabrication of the storage capacitors 32a and 32b, as illustrated in FIG. 4, will now be described in reference to FIGS. 5–10. As illustrated in FIG. 5, the containers 52a and 52b are formed in the substrate 50. The containers 52a and 52b may be formed by any suitable method, such as by using standard photolithographic and etching methods. Once the containers 52a and 52b have been formed, a layer of conductive material 60 (which will become the first layer of conductive material 54a and 54b) is deposited on the substrate 50 and in the containers 52a and 52b, as illustrated in FIG. 6. The conductive material 60 may be any suitable conductive material, such as polysilicon or metal. Advantageously, the conductive layer 60 is a blanket polysilicon deposition that coats the sides and bottoms of the containers 52a and 52b with polysilicon. Once the conductive layer 60 has been deposited, a layer of photoresist 62 is deposited over the conductive layer 60. The layer of photoresist 62 may be spun onto the conductive layer 60 and then baked to remove the solvent. It should be noticed that due to differential volume shrinkage, the thickness of the photoresist layer 62 over the containers 52a and 52b is typically less than the thickness of the photoresist layer 62 over areas that do not have containers.

An etchant, such as nitrogen trifluoride ($NF_3$) with oxygen, is then applied to the surface of the layer of photoresist 62. The etchant removes the photoresist 62 and the conductive layer 60 of polysilicon isotropically at a ratio of approximately 1:1. Advantageously, an end point is used to determine when the top surface 64 of the substrate 50 is clear of the conductive layer 60 in the regions where the layer of the photoresist 62 is thinnest, which is typically over the array of containers 52a and 52b. The end point may be provided by following the silicon fluoride peak in optical emissions, which begins when the conductive layer 60 of polysilicon is contacted by the etchant and drops when the conductive layer 60 of polysilicon has been removed by the etchant This first etching step produces the structure illustrated in FIG. 7. It should be noted that a thin portion of the photoresist layer 62 remains on the surface of the conductive layer 60 in an area spaced from the containers 52a and 52b. However, in the area of the containers 52a and 52b, the layer of photoresist 62 has been completely removed from the top surface 64 of the substrate 50, with photoresist 62 remaining within the containers 52a and 52b.

A short photoresist ash is used to remove any remaining photoresist 62 from the top surface of the conductive layer 60 of polysilicon and to recess the layer of photoresist 62 slightly within the containers 52a and 52b, as illustrated in FIG. 8. One example of a suitable photoresist ash is an oxygen-based plasma that burns off the surface photoresist. It should be noted that this short photoresist ash leaves portions of the photoresist layer 62 within the containers 52a and 52b to keep the bottom of the containers covered and to cover portions of the conductive layer 60 of polysilicon that are on the walls of the containers 52a and 52b.

Figure 9:
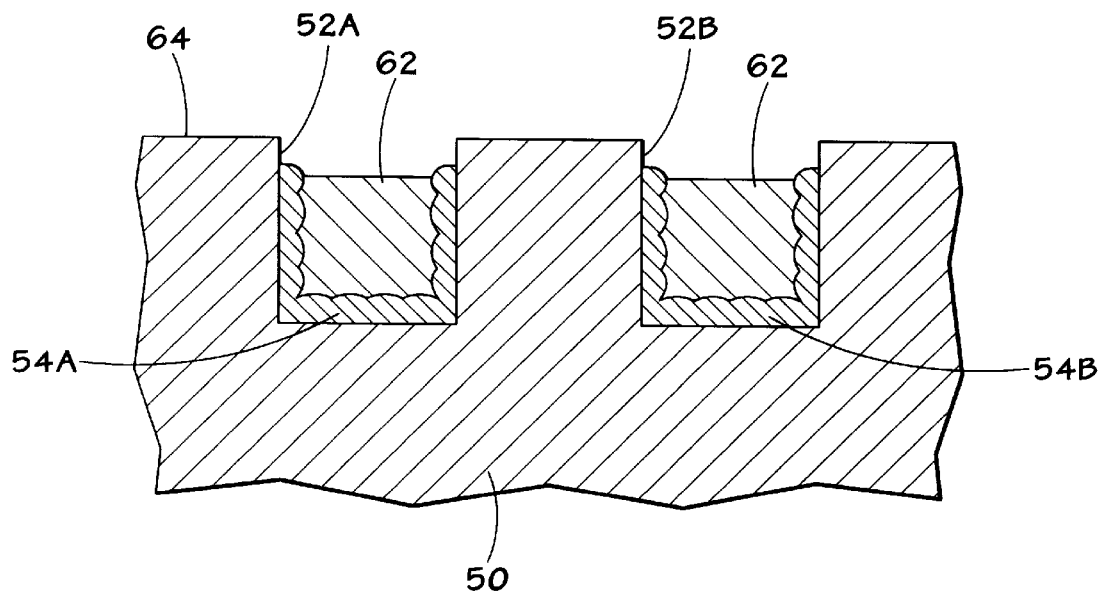
FIG. 9 illustrates the structure of FIG. 8 after an isotropic polysilicon etch process.

An anisotropic etchant, such as chlorine with hydrogen bromide, is then used to remove the remainder of the conductive layer 60 of polysilicon from the top surface 64 of the substrate 50 and, also, to recess the conductive layer 60 of polysilicon within the containers 52a and 52b to form the first conductive layers 54a and 54b, as illustrated in FIG. 9. The amount that the polysilicon within the containers 52a and 52b is recessed should be carefully controlled because capacitance will be lost as the first conductive layers or plates 54a and 54b become smaller. Advantageously, the amount that the polysilicon within the containers 52a and 52b is recessed may be controlled by the amount of time the etchant is used using known etch rates. The recessed polysilicon layers 54a and 54b within the containers reduce the chances of residual polysilicon remaining on the surface 64 between the containers, and, thus, reduces the chances of short circuits caused by such floaters.

Figure 10:
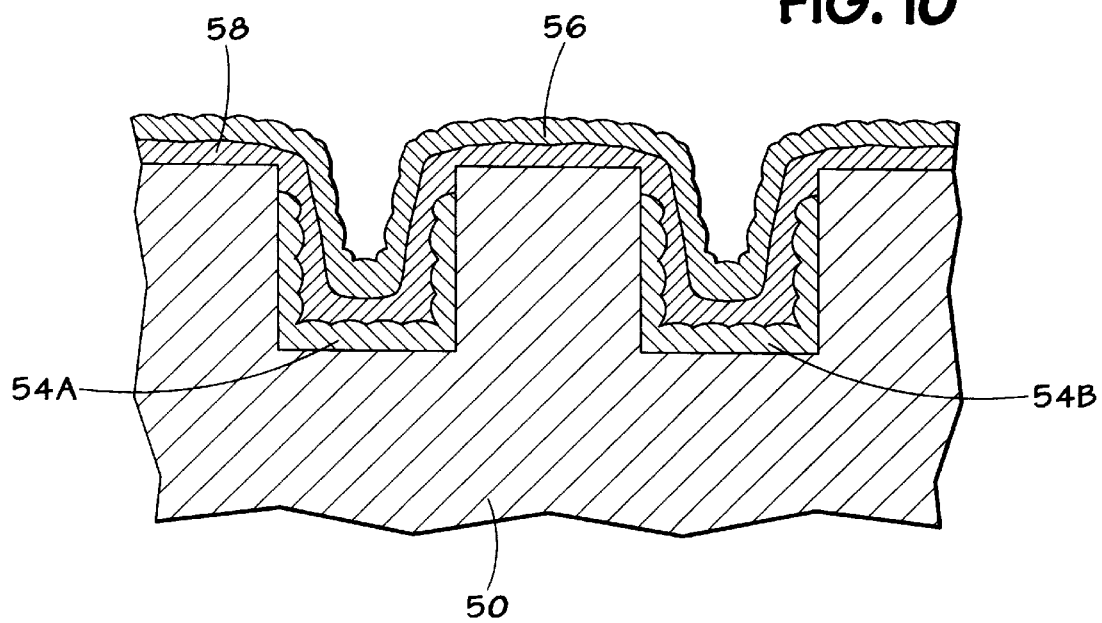
FIG. 10 illustrates the structure of FIG. 9 after removal of the remaining photoresist and after fabrication of a layer of dielectric and a second layer of polysilicon.

Once the first conductive layers 54a and 54b of polysilicon have been recessed within the containers 52a and 52b, the remaining photoresist 62 is then removed from the containers. Subsequently, as illustrated in FIG. 10, the layer of dielectric 58 and the second conductive layer 56 is deposited over the substrate 50 and into the containers 52a and 52b to cover the lower plates 54a and 54b. Alternatively, rather than having a common conductive layer 56, as illustrated in FIG. 10, portions of the dielectric layer 58 and the second conductive layer 56 may be removed by a suitable process, such as etching or chemical-mechanical planarization, to fabricate a storage capacitor 32 having a discreet upper plate 56, as illustrated in FIG. 4.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of forming a recessed microelectronic structure, the method comprising the steps of:
    (a) forming a container in a dielectric material, the dielectric material having an upper surface;
    (b) disposing a layer of conductive material within the container and over the upper surface of the dielectric material;
    (c) disposing a layer of dissimilar material over the layer of conductive material;
    (d) removing the layer of dissimilar material and the layer of conductive material from at least a portion of the upper surface of the dielectric material; and
    (e) recessing the layer of conductive material remaining in the container below the upper surface of the container.

2. The method, as set forth in claim 1, wherein the dissimilar material comprises photoresist.

3. The method, as set forth in claim 1, wherein the conductive material comprises polysilicon.

4. The method, as set forth in claim 1, wherein step (d) comprises the step of:
    etching through a first portion of the dissimilar material and a first portion of the conductive material to expose at least a portion of the upper surface of the dielectric material.

5. The method, as set forth in claim 1, wherein step (e) comprises the steps of:
    etching through a portion of the dissimilar material remaining in the container; and
    etching through a portion of the layer of conductive material to recess the layer of conductive material below the upper surface of the dielectric material.

6. A method of forming a recessed microelectronic structure, the method comprising the steps of:
    (a) forming a container in a substrate, the substrate having an upper surface;
    (b) disposing a layer of conductive material within the container and over the upper surface of the substrate;
    (c) disposing a layer of photoresist over the layer of conductive material;
    (d) removing the layer of photoresist and the layer of conductive material from at least a portion of the upper surface of the substrate to expose a portion of the upper surface of the substrate adjacent the container;
    (e) recessing the layer of conductive material remaining in the container below the upper surface of the container; and
    (f) removing the layer of photoresist remaining in the container.

7. The method, as set forth in claim 6, wherein the conductive material comprises polysilicon.

8. The method, as set forth in claim 6, wherein step (d) comprises the step of:
    etching through a first portion of the photoresist and a first portion of the conductive material to expose at least a portion of the upper surface of the substrate adjacent the container.

9. The method, as set forth in claim 6, wherein step (e) comprises the steps of:
    etching through a portion of the photoresist remaining in the container; and
    etching through a portion of the layer of conductive material to recess the layer of conductive material below the upper surface of the substrate.

10. The method, as set forth in claim 6, wherein step (f) comprises the step of:
    etching the layer of photoresist remaining in the container.

11. A method of forming a recessed microelectronic structure, the method comprising the steps of:
    (a) forming a container in a substrate, the substrate having an upper surface;
    (b) disposing a layer of conductive material within the container and over the upper surface of the substrate;
    (c) disposing a layer of photoresist over the layer of conductive material;
    (d) etching through a first portion of the layer of photoresist and a first portion of the layer of conductive material to expose a portion of the upper surface of the substrate adjacent the container;
    (e) etching through a second portion of the layer of photoresist remaining in the container; and
    (f) etching through a second portion of the layer of conductive material to remove the layer of conductive material from the upper surface of the substrate and to recess the layer of conductive material remaining in the container below the upper surface of the container.

12. The method, as set forth in claim 11, wherein the conductive material comprises polysilicon.

13. A method of forming a capacitor in a microelectronic circuit, the method comprising the steps of:
    (a) forming a container in a substrate, the substrate having an upper surface;
    (b) disposing a first layer of polysilicon within the container and over the upper surface of the substrate;
    (c) disposing a layer of photoresist over the first layer of polysilicon;
    (d) etching through a first portion of the layer of photoresist and a first portion of the first layer of polysilicon to expose a portion of the upper surface of the substrate adjacent the container;
    (e) etching through a second portion of the layer of photoresist remaining in the container;
    (f) etching through a second portion of the first layer of polysilicon to remove the first layer of polysilicon from the upper surface of the substrate and to recess the first layer of polysilicon remaining in the container below the upper surface of the container;
    (g) removing the layer of photoresist remaining in the container;
    disposing a layer of dielectric material over the recessed first layer of polysilicon and over the upper surface of the substrate;
    (i) disposing a second layer of polysilicon over the layer of dielectric material; and
    (j) removing the layer of dielectric material and the second layer of polysilicon from the upper surface of the substrate.

* * * * *